(12) United States Patent
Yu et al.

(10) Patent No.: US 10,236,057 B2
(45) Date of Patent: Mar. 19, 2019

(54) MEMORY CELLS AND METHODS FOR WRITING DATA TO MEMORY CELLS

(71) Applicant: Globalfoundries Singapore Pte. Ltd., Singapore (SG)

(72) Inventors: Cheong Sik Yu, Singapore (SG); Sriram Balasubramanian, Singapore (SG); Hari Balan, Singapore (SG); Tze Ho Simon Chan, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/605,326

(22) Filed: May 25, 2017

(65) Prior Publication Data

US 2018/0342290 A1 Nov. 29, 2018

(51) Int. Cl.
*G11C 11/419* (2006.01)
*G11C 5/14* (2006.01)

(52) U.S. Cl.
CPC ............ *G11C 11/419* (2013.01); *G11C 5/147* (2013.01)

(58) Field of Classification Search
CPC .............................. G11C 5/147; G11C 11/419
USPC .................................................. 365/154, 226
See application file for complete search history.

(56) References Cited

U.S. PATENT DOCUMENTS

| | | | | |
|---|---|---|---|---|
| 6,269,020 B1* | 7/2001 | Turner | ................ | G11C 11/4125 365/154 |
| 8,018,780 B2* | 9/2011 | Houston | ................ | G11C 5/143 365/154 |
| 8,400,820 B2* | 3/2013 | Rimondi | ................ | G11C 11/412 365/154 |
| 8,811,068 B1* | 8/2014 | Clark | ................ | H01L 29/7833 365/154 |
| 9,490,007 B1* | 11/2016 | Chan | ................ | G11C 11/419 |
| 9,673,201 B2* | 6/2017 | Liaw | ................ | H01L 23/528 |
| 9,799,660 B1* | 10/2017 | Wong | ................ | H01L 27/1104 |
| 2007/0171713 A1* | 7/2007 | Hunter | ................ | G11C 11/412 365/185.07 |
| 2008/0303105 A1* | 12/2008 | Chang | ................ | H01L 27/11 257/412 |
| 2009/0161410 A1* | 6/2009 | Houston | ................ | G11C 11/412 365/154 |
| 2009/0201730 A1* | 8/2009 | Lueng | ................ | G11C 11/404 365/185.08 |
| 2010/0124099 A1* | 5/2010 | Wu | ................ | G11C 11/412 365/154 |
| 2010/0315862 A1* | 12/2010 | Huang | ................ | G11C 11/412 365/156 |

(Continued)

*Primary Examiner* — Michael Tran

(74) *Attorney, Agent, or Firm* — Lorenz & Kopf, LLP

(57) ABSTRACT

Semiconductor memory devices and methods for writing data in memory cells are provided. An exemplary method for writing data in a memory cell includes providing the memory cell with a first pull-up transistor, a first power supply line coupled to the first pull-up transistor, a second pull-up transistor, and a second power supply line coupled to the second pull-up transistor. The method further includes applying a primary voltage from the first power supply line to the first pull-up transistor. The method also includes applying a secondary voltage from the second power supply line to the second pull-up transistor, wherein the secondary voltage is higher than the primary voltage. Further, the method includes performing a write operation to save a selected value in the memory cell.

12 Claims, 3 Drawing Sheets

(56) References Cited

U.S. PATENT DOCUMENTS

| | | | |
|---|---|---|---|
| 2012/0212996 A1* | 8/2012 | Rao | G11C 11/419 |
| | | | 365/154 |
| 2013/0141962 A1* | 6/2013 | Liaw | G11C 11/412 |
| | | | 365/154 |
| 2013/0154027 A1* | 6/2013 | Liaw | G11C 11/412 |
| | | | 257/390 |
| 2013/0170275 A1* | 7/2013 | Kumar | G11C 11/412 |
| | | | 365/63 |
| 2013/0235649 A1* | 9/2013 | Lindstadt | G11C 13/0035 |
| | | | 365/148 |
| 2013/0293250 A1* | 11/2013 | McMahon | G01R 31/30 |
| | | | 324/750.3 |
| 2014/0085966 A1* | 3/2014 | Song | H01L 29/41791 |
| | | | 365/154 |
| 2014/0269023 A1* | 9/2014 | Katoch | G11C 11/419 |
| | | | 365/154 |
| 2014/0269091 A1* | 9/2014 | Zheng | G11C 16/28 |
| | | | 365/185.21 |
| 2015/0302917 A1* | 10/2015 | Grover | G11C 11/412 |
| | | | 365/51 |
| 2015/0303270 A1* | 10/2015 | Liaw | H01L 29/42392 |
| | | | 257/9 |
| 2015/0380078 A1* | 12/2015 | Liaw | G11C 11/419 |
| | | | 365/156 |
| 2015/0380079 A1* | 12/2015 | Agarwal | G11C 11/419 |
| | | | 365/156 |
| 2016/0012881 A1* | 1/2016 | Kuo | G11C 11/419 |
| | | | 365/156 |
| 2016/0043092 A1* | 2/2016 | Mojumder | G11C 11/412 |
| | | | 257/369 |
| 2017/0178719 A1* | 6/2017 | Wu | G11C 11/419 |
| 2017/0338233 A1* | 11/2017 | Huang | H01L 27/1104 |
| 2017/0358343 A1* | 12/2017 | Liaw | G11C 11/414 |

* cited by examiner

MEMORY CELLS AND METHODS FOR WRITING DATA TO MEMORY CELLS

TECHNICAL FIELD

The technical field generally relates to static random access memory (SRAM), and more particularly relates to writing data to SRAM cells.

BACKGROUND

Static random access memory (SRAM) is a type of volatile semiconductor memory for storing binary logic "1" and "0". The SRAM sizing has been scaled down due to the increased density of SRAM in System-On-Chip (SoC) and other integrated devices that work on lower supply voltage. For example, the internet of things (IoT) typically needs ultralow power (ULP) operation for low power consumption. As used in the industry, ULP operation is lower than low power (LP) operation voltage by over 200 mV at the same technology node.

SRAM scaling leads to a considerable amount of power saving, but the stability and performance of the SRAM circuit is negatively affected due to the scaling of supply voltage. For example, write ability degrades at low voltage due to low read current with ULP processing. Therefore, it is known that it may be necessary to take precautions to ensure that write ability is maintained.

A failure to write may occur when a pass-gate transistor is not strong enough to overpower a pull-up transistor and pull an internal node of a memory cell to ground (writing "0"). The increased strength of pull-up transistors or the decreased strength of pass-gate transistors due to process variations impedes the discharge process through the pass-gate transistor. Furthermore, process variations also reduce the trip point of inverters holding the state "HIGH", resulting in write failure. Techniques to provide successful write operation have focused on increasing the strength of the pass-gate transistors.

Another writing error, referred to as the "half-select" or "write disturb" error, occurs at memory cells on a word line that is on and in a column that is not selected, which leads to poor stability. During a write operation, all the write access transistors in a selected row are turned on by a common word line. In unselected columns, write bit lines are floating, such as at Vdd. Thus, the half-selected cells in the unselected columns may be under an unwanted disturbance condition.

Accordingly, it is desirable to provide improved memory cells and methods for writing data to memory cells. Further, it is desirable to provide techniques that support write ability in memory cells. Furthermore, other desirable features and characteristics will become apparent from the subsequent detailed description and the appended claims, taken in conjunction with the accompanying drawings and this background.

BRIEF SUMMARY

Semiconductor memory devices and methods for writing data in memory cells are provided. In an embodiment, a method for writing data in a memory cell includes providing the memory cell with a first pull-up transistor, a first power supply line coupled to the first pull-up transistor, a second pull-up transistor, and a second power supply line coupled to the second pull-up transistor. The method further includes applying a primary voltage from the first power supply line to the first pull-up transistor. The method also includes applying a secondary voltage from the second power supply line to the second pull-up transistor, wherein the secondary voltage is higher than the primary voltage. Further, the method includes performing a write operation to save a selected value in the memory cell.

In another exemplary embodiment, a method for writing data in memory cells includes providing first and second memory cells, wherein each memory cell includes a first pull-up transistor and a first pass-gate transistor. The method includes applying a first primary voltage to the first pull-up transistor of the first memory cell. The method further includes applying a second primary voltage to the first pull-up transistor of the second memory cell, wherein the second primary voltage is higher than the first primary voltage. Also, the method includes applying a first value to the first pass-gate transistor of the first memory cell. Further, the method includes opening the first pass-gate transistor of each memory cell.

In yet another exemplary embodiment, a semiconductor memory device is provided. The semiconductor memory device includes a plurality of bit cells. Each bit cell includes a first inverter, a first supply voltage line coupled to the first inverter, a second inverter cross-coupled with the first inverter, and a second supply voltage line coupled to the first inverter. The second supply voltage line is independent from the first supply voltage line.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the semiconductor memory devices or methods for writing data to memory cells. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. Further, it is noted that semiconductor memory cells and arrays thereof include a varying number of components and that single components shown in the illustrations may be representative of multiple components.

As described herein, memory cells and methods for writing data to memory cells utilize separated and independent power supply lines to apply different voltages to the pull-up transistors of the memory cells. Thus, memory cells can be provided with asymmetric power supply if so desired. Application of a higher voltage to a source of a pull-up transistor provides the pull-up transistor with a lower threshold voltage (Vth) and a higher drain current in the ON state (Ion) than a pull-up transistor with a source on which a lower voltage is applied. Further, application of a lower voltage to a source of a pull-up transistor provides the pull-up transistor with a higher threshold voltage (Vth) and a lower drain current in the ON state (Ion) than a pull-up transistor with a source on which a higher voltage is applied. Embodiments are provided herein that apply different voltages to the pull-up transistors of a selected memory cell while writing data to the selected memory cell to avoid unintentionally writing data to half-selected memory cells, i.e., memory cells sharing a common word line with the selected memory cell.

Figure 1:
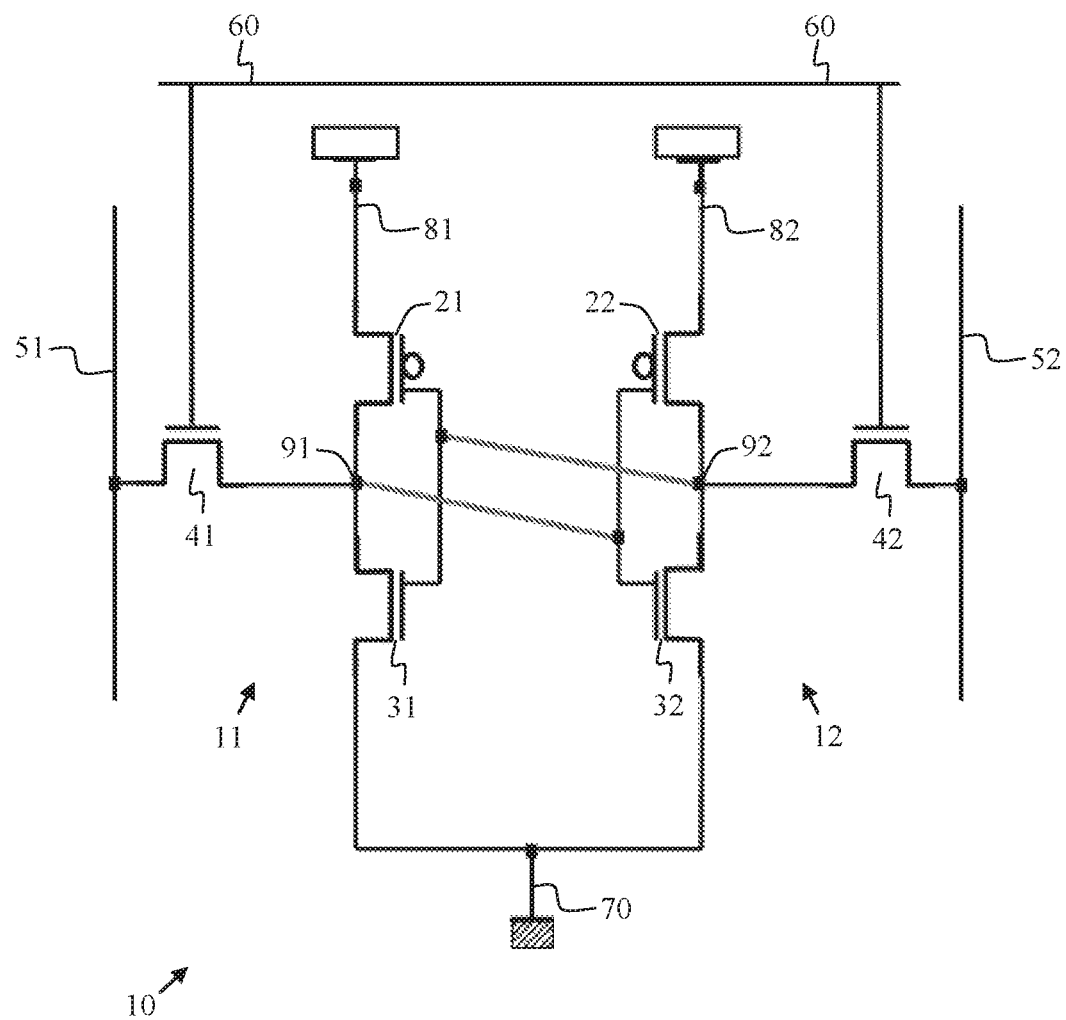
FIG. 1 schematically illustrates a bit cell or memory cell in accordance with an embodiment herein.

FIG. 1 schematically illustrates a memory cell or bit cell 10. The exemplary memory cell 10 is a six transistor (6T) static random access memory (SRAM) cell 10 arranged with a first inverter 11 and with a second inverter 12 cross-coupled to the first inverter 11.

Specifically, memory cell 10 includes a first pull-up transistor 21 and a second pull-up transistor 22, a first pull-down transistor 31 and a second pull-down transistor 32, and a first pass-gate transistor 41 and a second pass-gate transistor 42. The first pull-up transistor 21 and the first pull-down transistor 31 form the first inverter 11. The second pull-up transistor 22 and the second pull-down transistor 32 form the second inverter 12.

In an exemplary embodiment, the first pull-up transistor 21 is a P-type field effect transistor (PFET) and the second pull-up transistor 22 is a P-type field effect transistor (PFET). Further, the exemplary first pull-down transistor 31 is an N-type field effect transistor (NFET) and the exemplary second pull-down transistor 32 is an N-type field effect transistor (NFET). In an exemplary embodiment, each pass-gate transistor 41 and 42 an N-type field effect transistor (NFET). Further, each pass-gate transistor 41 and 42 may be a low threshold voltage field effect transistor with a substantially lower threshold voltage than the pull-down transistors 31 and 32.

As shown, a first bit line (BLA) 51 is provided and is electrically coupled to the first pass-gate transistor 41. Further, a second bit line (BLB) 52 is provided and is electrically coupled to the second pass-gate transistor 42.

As configured, the first bit line 51 may apply a signal with a first value to the first pass-gate transistor 41, while the second bit line 52 may apply a signal with a second value to the second pass-gate transistor 42. Generally, the first value may be logic LOW voltage, such as "0", or logic HIGH voltage, such as "1". Likewise, the second value may be a logic HIGH voltage, such as "1", or a logic LOW voltage, such as "0". The first bit line 51 and the second bit line 52 are independently controllable to apply signals of different values.

Also, a word line (WL) 60 is provided and is electrically coupled both to the first pass-gate transistor 41 and to the second pass-gate transistor 42. The word line 60 may be controlled to apply a voltage on each of the pass-gate transistors 41 and 42 sufficient to open the pass-gate transistors 41 and 42.

Further, the memory cell 10 is provided with a ground line 70. The ground line 70 is common to, and is electrically connected to, the first pull-down transistor 31 and the second pull-down transistor 32. As configured, the ground line 70 may apply a same or common ground voltage (Vss) to the first pull-down transistor 31 and the second pull-down transistor 32.

In FIG. 1, the first inverter 11 is electrically coupled to a first power supply line (VDDA) 81. Specifically, the first power supply line 81 is electrically coupled to the first pull-up transistor 21. Also, the second inverter 12 is electrically coupled to a second power supply line (VDDB) 82. Specifically, the second power supply line 82 is electrically coupled to the second pull-up transistor 22.

The first power supply line 81 is independent of the second power supply line 82. Thus, the first power supply line 81 and the second power supply line 82 may be independently controlled and operated to apply different voltages to the first pull-up transistor 21 and the second pull-up transistor 22 as described below.

For example, the first power supply line 81 may apply a primary supply voltage (Vdd) and the second power supply line 82 may apply a secondary supply voltage (Vdd+a). Alternatively, the first power supply line 81 may apply a primary supply voltage (Vdd−α) and the second power supply line 82 may apply a secondary supply voltage (Vdd). In exemplary embodiments, the primary supply voltage is higher than the secondary supply voltage, such as by a volts. While the supply voltages will vary depending on the technology node, in an exemplary embodiment, a is from about 10% to about 35% of Vdd. Generally, for 40 LP operation, Vdd is about 1.1 V, while for 40 ULP operation, Vdd is about 0.9V. While these ranges are provided for background, the memory cells and methods for writing data to memory cells are not limited to any specific voltage range. Because a is from about 10% to about 35% of Vdd, secondary supply voltage will be lower than primary supply voltage, but may still be a logic HIGH voltage signal when primary supply voltage is a logic HIGH voltage signal.

Each transistor 21, 22, 31, 32, 41 and 42 includes a source, a drain, and a gate. In FIG. 1, the first power supply line 81 is electrically coupled to the source of the first pull-up transistor 21. Further, the second power supply line 82 is electrically coupled to the source of the second pull-up transistor 22. Also, the ground line 70 is electrically coupled to the source of the first pull-down transistor 31 and to the source of the second pull-down transistor 32.

In FIG. 1, the word line 60 is electrically coupled to the gate of the pass-gate transistor 41 and to the gate of the pass-gate transistor 42. Also, the bit line 51 is electrically coupled to the source of the first pass-gate transistor 41. Further, the bit line 52 is electrically coupled to the source of the second pass-gate transistor 42.

In operation, the memory cell forms two complementary nodes, first node 91 and second node 92. As shown, a first node 91 is formed between and electrically coupled to the drain of the first pull-up transistor 21 and the drain of the first pull-down transistor 31. The first node 91 is electrically coupled to the drain of the first pass-gate transistor 41. Further, the first node 91 is electrically coupled to the gate of the second pull-up transistor 22 and the gate of the second pull-down transistor 32.

As shown, a second node 92 is formed between and electrically coupled to the drain of the second pull-up transistor 22 and the drain of the second pull-down transistor 32. The second node 92 is electrically coupled to the drain of the second pass-gate transistor 42. Further, the node 92 is electrically coupled to the gate of the first pull-up transistor 21 and the gate of the first pull-down transistor 31.

Because first node 91 is tied to the gate of the second pull-up transistor 22 and second node 92 is tied to the gate of the first pull-up transistor 21, the values stored in each node 91 and 92 will remain complementary to each other when the primary supply voltage and the secondary supply voltage are both a logic HIGH value or both a logic LOW value. For example, when first node 91 is HIGH, the second pull-up transistor 22 prevents the current from second power supply line 82 from flowing to second 92. In parallel, the gate of the second pull-down transistor 32 is activated, allowing any charge that may be in second 92 to go to ground. Furthermore, when second node 92 is LOW, the first pull-up transistor 21 allows current to flow from first power supply line 81 to first node 91, and the gate of the first pull-down transistor 31 is de-activated, preventing the charge in first node 91 from going to ground. The gates of the first pass-gate transistor 41 and the second pass-gate transistor 42 are electrically coupled to word line (WL) 60 to control reading data from and writing data to the memory cell 10. Values stored in first node 91 and second node 92 are read on a first bit line 51 and a complementary second bit line 52, respectively, which are electrically coupled to a sense amplifier (not shown).

Figure 2:
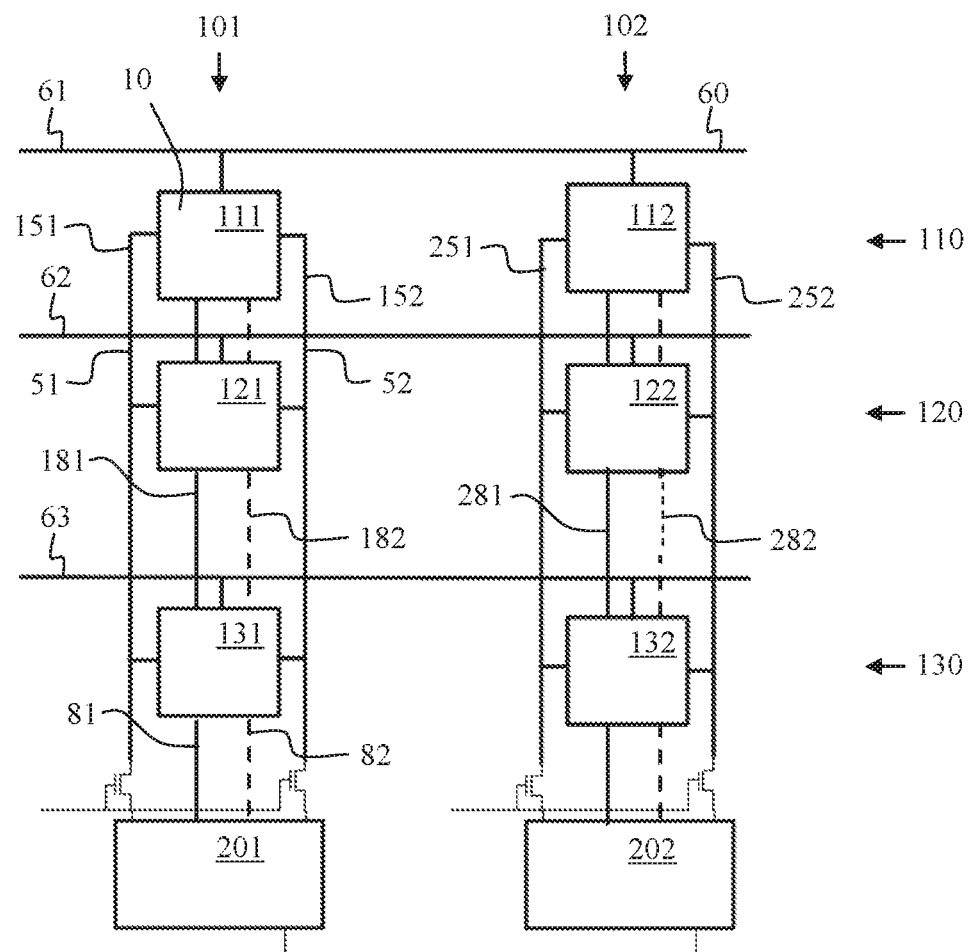
FIG. 2 schematically illustrates an array of memory cells as illustrated in FIG. 1.

FIG. 2 illustrates an array of memory cells 10, each of which is formed as the memory cell 10 of FIG. 1, that may be Write accessed to store data and Read accessed to retrieve the stored data. In FIG. 2, memory cells 111, 121, and 131 are aligned in column 101 while memory cells 112, 122, and 132 are aligned in column 102. Further, memory cells 111 and 112 are aligned in row 110, memory cells 121 and 122 are aligned in row 120, and memory cells 131 and 132 are aligned in row 130.

As shown, a word line 60 is electrically connected to and shared by each memory cell 10 in a common row. Individual word lines 61, 62, and 63 are numbered in FIG. 2. As shown, word line 61 is electrically connected to and shared by memory cells 111 and 112 in row 110, word line 62 is electrically connected to and shared by memory cells 121 and 122 in row 120, and word line 61 is electrically connected to and shared by memory cells 131 and 132 in row 130. As described above, the each word line 60 is electrically coupled to pass-gate transistors in each respective memory cell 10.

Further, a first bit line 51 is electrically connected to and shared by each memory cell 10 in a common column. First bit lines 51 are individually numbered 151 and 251 in FIG. 2. As shown, a first bit line 151 is electrically connected to and shared by memory cells 111, 121, and 131 in column 101. Further, a first bit line 251 is electrically connected to and shared by memory cells 112, 122, and 132 in column 102. As described above, each first bit line 51 is electrically coupled to first pass-gate transistors in each respective memory cell 10.

Likewise, a second bit line 52 is electrically connected to and shared by each memory cell 10 in a common column. Second bit lines 52 are individually numbered 152 and 252 in FIG. 2. As shown, a second bit line 152 is electrically connected to and shared by memory cells 111, 121, and 131 in column 101. Further, a second bit line 252 is electrically connected to and shared by memory cells 112, 122, and 132 in column 102. As described above, each first bit line 52 is electrically coupled to second pass-gate transistors in each respective memory cell 10.

In FIG. 2, a first power supply line 81 is electrically connected to and shared by each memory cell 10 in a common column. First power supply lines 81 are individually numbered 181 and 281 in FIG. 2. For example, first power supply line 181 is electrically connected to and shared by memory cells 111, 121, and 131 in column 101. Further, a first power supply line 281 is electrically connected to and shared by memory cells 112, 122, and 132 in column 102. First power supply line 181 is independent from first power supply line 281.

Also, a second power supply line 82 is electrically connected to and shared by each memory cell 10 in a common column. Second power supply lines 82 are individually numbered 182 and 282 in FIG. 2. For example, second power supply line 182 is electrically connected to and shared by memory cells 111, 121, and 131 in column 101. Further, a second power supply line 282 is electrically connected to and shared by memory cells 112, 122, and 132 in column 102. Second power supply line 182 is independent from second power supply line 282. Further, first power supply lines 81 are independent of second power supply lines 82.

In the embodiment of FIG. 2, column 101 is provided with a first write circuit 201 to control first bit line 151 and second bit line 152. Further, first write circuit 201 is provided to control first power supply line 181 and second power supply line 182. Also, column 102 is provided with a second write circuit 202 to control first bit line 251 and second bit line 252. Further, first write circuit 201 is provided to control first power supply line 281 and second power supply line 282.

Figure 3:
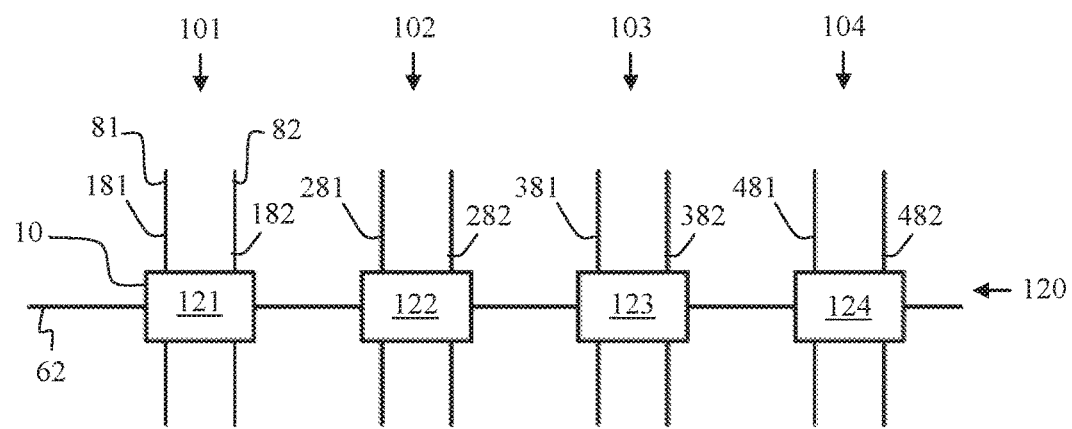
FIG. 3 is a schematic view of a row of memory cells from FIG. 1 illustrating independent power supply lines.

FIG. 3 illustrates a single row of memory cells 10 in the array of memory cells. For example, the illustrated row may be row 120 from FIG. 2. In FIG. 3, row 120 includes memory cells 121, 122, 123 and 124 from four columns 101, 102, 103 and 104. Word line 62 is electrically coupled to each memory cell 121, 122, 123 and 124.

As shown, a first power supply line 81 is electrically connected to each memory cell 10. For example, first power supply line 181 is electrically connected to memory cell 121, first power supply line 281 is electrically connected to memory cell 122, first power supply line 381 is electrically connected to memory cell 123, and first power supply line 481 is electrically connected to memory cell 124.

Further, a second power supply line 82 is electrically connected to each memory cell 10. For example, second power supply line 182 is electrically connected to memory cell 121, second power supply line 282 is electrically connected to memory cell 122, second power supply line 382 is electrically connected to memory cell 123, and second power supply line 482 is electrically connected to memory cell 124.

Example 1

Cross-referencing FIGS. 1-3, an exemplary method for writing data to a memory cell 10 is described. In the method, a memory cell 10 is selected. In the exemplary embodiment, in the selected memory cell 10 (and in non-selected memory cells 10 in the same row) the first node 91 is HIGH and second node 92 is LOW. In an exemplary embodiment, memory cell 121 is selected. Upon selection of the memory cell, the first bit line 51 of the selected memory cell 10, i.e., first bit line 151 of memory cell 121, is pre-charged with a LOW value. Further, the second bit line 52 of the selected memory cell 10, i.e., second bit line 152 of memory cell 121, is pre-charged with a HIGH value. Further, all non-selected bit lines 51 and 52, i.e., bit lines 51 and 52 other than selected bit line 151 are pre-charged with a HIGH value.

Further, during the exemplary write operation, a first primary voltage is applied by the first power supply line 81 of the selected memory cell 10, i.e., first power supply line 181 of memory cell 121. Further, a first secondary voltage is applied by the second power supply line 82 of the selected memory cell 10, i.e., second power supply line 182 of memory cell 121. The first secondary voltage is higher than the first primary voltage. For example, the first secondary voltage may be (Vdd+α) while the first primary voltage is (Vdd).

At the first power supply lines 81 of the non-selected memory cells 10, e.g., first power supply lines 281, 381, and 481, a primary voltage lower than the first secondary voltage is applied to the respective memory cells 10. For example, first power supply lines 281, 381, and 481 may apply a primary voltage of (Vdd). Likewise, at the second power supply lines 82 of the non-selected memory cells 10, e.g., second power supply lines 282, 382, and 482, a secondary voltage lower than the first secondary voltage is applied to the respective memory cells 10. For example, second power supply lines 282, 382, and 482 may apply a secondary voltage of (Vdd).

Further, during the exemplary write operation, the word line 60 of the selected memory cell 10, i.e., word line 62, applies a signal to open the pass-gate transistors of the memory cells 10 in row 120. In conventional memory cell designs, opening the pass-gate transistors of the non-selected memory cells 10 in row 120 may cause a "half select" or "write disturb" error. As described herein, such error is avoided by the use of the higher secondary voltage from the second power supply line 182 to the selected memory cell 121.

Due to the relatively higher voltage, such as (Vdd+α), applied to the source of the second pull-up transistor 22 in the selected memory cell 121, the second pull-up transistor 22 in the selected memory cell 121 has a lower threshold voltage (Vth) and a higher drain current in the ON state (Ion) than second pull-up transistor 22 in the non-selected memory cells. Thus, the second pull-up transistor 22 is easier to turn ON than a second pull-up transistor having a relatively lower voltage applied, i.e., the second pull-up transistors in the non-selected memory cells 10 in row 120 (the half-selected memory cells 122, 123, and 124). Further, the voltage at the second node 92 is raised quickly, thus making the first pull-up transistor in the selected memory cell 121 easier to turn OFF.

Because the half-selected memory cells 122, 123, and 124 have the lower voltage, such as (Vdd), applied to the second pull-up transistors 22, the second pull-up transistors 22 in the half-selected memory cells 122, 123 and 124 are not as prone to being accidently turned ON while writing data to memory cell 121.

Table 1 provides a summary of the values of the nodes, bit lines, and power supply lines of EXAMPLE 1:

TABLE 1

| Node | HIGH (1) | LOW (0) | HIGH (1) | LOW (0) |
|------|----------|---------|----------|---------|
| BLA  | LOW      | —       | HIGH     | —       |
| BLB  | —        | HIGH    | —        | HIGH    |
| VDDA | Vdd      |         | Vdd      |         |
| VDDB |          | Vdd + α |          | Vdd     |

Example 2

Cross-referencing FIGS. 1-3, another exemplary method for writing data to a memory cell 10 is described. The process is identical to that of EXAMPLE 1, until the application of the first primary voltage and first secondary voltage. In EXAMPLE 2, during the exemplary write operation, the first secondary voltage is again higher than the first primary voltage. However, the first secondary voltage may be (Vdd) while the first primary voltage is (Vdd−α). Further, at the first power supply lines 81 of the non-selected memory cells 10, e.g., first power supply lines 281, 381, and 481, a primary voltage higher than the first primary voltage is applied to the respective memory cells 10. For example, first power supply lines 281, 381, and 481 may apply a primary voltage of (Vdd). Likewise, at the second power supply lines 82 of the non-selected memory cells 10, e.g., second power supply lines 282, 382, and 482, a secondary voltage higher than the first primary voltage is applied to the respective memory cells 10. For example, second power supply lines 282, 382, and 482 may apply a secondary voltage of (Vdd).

Again, during the exemplary write operation, the word line 60 of the selected memory cell 10, i.e., word line 62, applies a signal to open the pass-gate transistors of the memory cells 10 in row 120. In conventional memory cell designs, opening the pass-gate transistors of the non-selected memory cells 10 in row 120 may cause a "half select" or "write disturb" error. As described herein, such error is avoided by the use of the lower primary voltage from the first power supply line 181 to the selected memory cell 121. Due to the relatively lower voltage, such as (Vdd−α), applied to the source of the first pull-up transistor 21 in the selected memory cell 121, the first pull-up transistor 21 has a higher threshold voltage (Vth) and a lower drain current in the ON state (Ion). Thus, the first pull-up transistor 21 is easier to turn OFF than a first pull-up transistor having a relatively higher voltage applied to its source. Further, because the first pull-up transistor 21 is weak, i.e., has a lower drain current in the ON state (Ion), voltage at the first node 91 decreases quickly and, as a result, the second pull-up transistor 22 in the selected memory cell 121 is easier to turn ON.

Because the half-selected memory cells 122, 123, and 124 have the higher voltage, such as (Vdd), applied to the first pull-up transistors 21, the first pull-up transistors 21 in the half-selected memory cells 122, 123 and 124 are not as prone to being accidently turned OFF while writing data to memory cell 121.

Table 2 provides a summary of the values of the nodes, bit lines, and power supply lines of EXAMPLE 2:

TABLE 2

| Node | HIGH (1) | LOW (0) | HIGH (1) | LOW (0) |
|------|----------|---------|----------|---------|
| BLA  | LOW      | —       | HIGH     | —       |
| BLB  | —        | HIGH    | —        | HIGH    |
| VDDA | Vdd − α  |         | Vdd      |         |
| VDDB |          | Vdd     |          | Vdd     |

As described herein, a memory cell is provided for operation at ultralow voltage while avoiding "half-select" or "write disturb" issues. Specifically, an exemplary memory cell uses a first power supply line to apply a primary voltage to a first pull-up transistor and a second power supply line, independent of the first power supply line, to apply a secondary voltage, higher that the primary voltage, to a second pull-up transistor. Use of independent power supply lines provides for selectively applying voltages to the pull-up transistors of a selected memory cell, and to pull-up transistors of half-selected memory cells, to inhibit unintentionally turning pull-up transistors of half-selected memory cells OFF or ON. Specifically, due to the application of different voltages as described herein, the pull-up transistors of the selected memory cell are more easily turned OFF or ON, despite use of low voltages.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for writing data in a selected memory cell from a row of memory cells, wherein each memory cell includes a first pull-up transistor coupled to a respective first power supply line, a second pull-up transistor coupled to a respective second power supply line, a first pass-gate transistor coupled to a respective first bit line and to a word line, a second pass-gate transistor coupled to a respective second bit line and to the word line, a first node isolated between the first pull-up transistor and the first pass-gate transistor, a second node isolated between the second pull-up transistor and the second pass-gate transistor, the method comprising:
identifying the selected memory cell, wherein remaining memory cells in the row of memory cells are non-selected memory cells;
applying a first secondary voltage from the second power supply line to the second pull-up transistor of the selected memory cell;
applying a first primary voltage from the first power supply line to the first pull-up transistor of the selected memory cell, wherein the first primary voltage is lower than the first secondary voltage;
applying a second primary voltage by respective first power supply lines to the respective first pull-up transistors of the non-selected memory cells, wherein the second primary voltage is lower than the first secondary voltage;
applying a second secondary voltage by respective second power supply lines to the respective second pull-up transistors of the non-selected memory cells, wherein the second secondary voltage is lower than the first secondary voltage; and
applying a signal from the word line to the pass-gate transistors of the memory cells in the row of memory cells, wherein the signal opens only the pass-gate transistors of the selected memory cell.

2. The method of claim 1 wherein the first secondary voltage equals Vdd+α, the first primary voltage equals Vdd, the second secondary voltage equals Vdd, and the second primary voltage equals Vdd.

3. The method of claim 1 further comprising:
pre-charging the first bit line of the selected memory cell with a LOW value;
pre-charging the second bit line of the selected memory cell with a HIGH value; and
pre-charging the first bit lines and the second bit lines of the non-selected memory cells with the HIGH value.

4. The method of claim 1 wherein:
each transistor comprises a source, a drain, and a gate;
applying the first primary voltage from the first power supply line to the first pull-up transistor of the selected memory cell comprises applying the first primary voltage to the source of the first pull-up transistor of the selected memory cell; and
applying the first secondary voltage from the second power supply line to the second pull-up transistor of the selected memory cell comprises applying the first secondary voltage to the source of the second pull-up transistor of the selected memory cell.

5. The method of claim 1 wherein:
each memory cell includes a first pull-down transistor and a second pull-down transistor coupled to a common ground line;
in each memory cell, the first pull-up transistor and the first pull-down transistor form a first inverter;
in each memory cell, the second pull-up transistor and the second pull-down transistor form a second inverter;
in each memory cell, the first inverter and the second inverter are cross-coupled; and
the method further comprises applying a ground voltage to the first pull-down transistor and to the second pull-down transistor in each memory cell from the common ground line.

6. The method of claim 1 wherein:
each memory cell includes a first pull-down transistor and a second pull-down transistor;
each first pull-up transistor is a P-type field effect transistor (PFET);
each second pull-up transistor is a P-type field effect transistor (PFET);
each first pull-down transistor is an N-type field effect transistor (NFET);
each second pull-down transistor is an N-type field effect transistor (NFET);
each transistor comprises a source, a drain, and a gate;
in each memory cell, the first pull-up transistor and the first pull-down transistor form a first inverter;
in each memory cell, the second pull-up transistor and the second pull-down transistor form a second inverter;
in each memory cell, the first inverter and the second inverter are cross-coupled;
a common ground line is connected to the source of each first pull-down transistor and to the source of each second pull-down transistor;
the word line is connected to the gate of each pass-gate transistor;
the method further comprises applying a ground voltage to the source of each first pull-down transistor and to the source of each second pull-down transistor from the common ground line;
applying the first primary voltage from the first power supply line to the first pull-up transistor of the selected memory cell comprises applying the first primary voltage to the source of the first pull-up transistor of the selected memory cell; and
applying the first secondary voltage from the second power supply line to the second pull-up transistor of the selected memory cell comprises applying the first secondary voltage to the source of the second pull-up transistor of the selected memory cell.

7. A method for writing data in memory cells comprising:
providing a first memory cell and a second memory cell, wherein each memory cell includes a first pull-up transistor, a first pass-gate transistor coupled to a respective first bit line, a first node isolated between the first pull-up transistor and the first pass-gate transistor, a second pull-up transistor, a second pass-gate transistor coupled to a respective second bit line, and a second node isolated between the second pull-up transistor and the second pass-gate transistor;

applying a first voltage to the first pull-up transistor of the first memory cell;

applying the first voltage to the first pull-up transistor of the second memory cell;

applying a second voltage to the first pull-up transistor of the second memory cell, wherein the second voltage is higher than the first voltage;

applying the first voltage to the second pull-up transistor of the second memory cell; and applying a signal to the pass-gate transistors of the first memory cell and the second memory cell, wherein applying the signal to the pass-gate transistors of the first memory cell and the second memory cell opens only the pass-gate transistors of the first memory cell.

8. The method of claim 7 wherein each memory cell includes a first pull-down transistor and a ground line connected to the respective pull-down transistor for applying a ground voltage thereto.

9. The method of claim 7 wherein each memory cell includes a first power supply line, wherein applying the first voltage to the first pull-up transistor of the first memory cell comprises applying the first voltage from the first power supply line to the first pull-up transistor of the first memory cell; and applying the second voltage to the first pull-up transistor of the second memory cell comprises applying the second voltage from the first power supply line to the first pull-up transistor of the second memory cell.

10. The method of claim 7 wherein:

each first pass-gate transistor comprises a source, a drain, and a gate, wherein applying the signal to the pass-gate transistors of the first memory cell and the second memory cell comprises applying the signal from a word line to the gate of the pass-gate transistor of each memory cell.

11. The method of claim 7 wherein:

each transistor comprises a source, a drain, and a gate, applying the first voltage to the first pull-up transistor of the first memory cell comprises applying the first voltage to the source of the first pull-up transistor of the first memory cell;

applying the second voltage to the first pull-up transistor of the second memory cell comprises applying the second voltage to the source of the first pull-up transistor of the second memory cell;

applying the signal to the pass-gate transistors of the first memory cell and the second memory cell comprises applying the signal from a word line to the gate of the first pass-gate transistor of each memory cell.

12. The method of claim 7 wherein:

each memory cell includes the first pull-up transistor, a second pull-up transistor, a first pull-down transistor, a second pull-down transistor, the first pass-gate transistor, and a second pass-gate transistor, and wherein each transistor comprises a source, a drain, and a gate;

a ground line is connected to the source of each pull-down transistor for applying a ground voltage thereto, a first power supply line is connected to the source of the first pull-up transistor;

a second power supply line is connected to the source of the second pull-up transistor; and a word line is connected to the gate of each pass-gate transistor of each memory cell.

* * * * *